(12) United States Patent
Hashimoto

(10) Patent No.: US 6,335,563 B1
(45) Date of Patent: Jan. 1, 2002

(54) SEMICONDUCTOR DEVICE, METHOD OF FABRICATING THE SAME, CIRCUIT BOARD, AND ELECTRONIC DEVICE

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/347,519

(22) Filed: Jul. 6, 1999

(30) Foreign Application Priority Data

Jul. 6, 1998 (JP) .................................................. 10-205824
Jun. 1, 1999 (JP) .................................................. 11-153304

(51) Int. Cl.[7] .................................................. H01L 23/58
(52) U.S. Cl. ........................... 257/632; 257/701; 438/118
(58) Field of Search .................................... 257/618, 632, 257/684, 701, 705; 438/118, 119, 778

(56) References Cited

U.S. PATENT DOCUMENTS

| 5,162,262 | A | * | 11/1992 | Ajika et al. | .................. 437/200 |
| 5,261,593 | A | * | 11/1993 | Casson et al. | ........... 228/180.22 |
| 5,646,439 | A | * | 7/1997 | Kitayama et al. | ............. 257/632 |
| 5,847,466 | A | * | 12/1998 | Ito et al. | ......................... 257/775 |
| 5,892,271 | A | * | 4/1999 | Takeda et al. | ................. 257/668 |
| 6,075,710 | A | * | 6/2000 | Lau | ............................... 361/760 |
| 6,104,081 | A | * | 8/2000 | Dekker et al. | ............... 257/618 |
| 6,249,046 | B1 | * | 6/2001 | Hashimoto | .................... 257/691 |

* cited by examiner

Primary Examiner—Hoanganh Le
Assistant Examiner—Thuy Vinh Tran
(74) Attorney, Agent, or Firm—Oliff & Berridge, PLC

(57) ABSTRACT

A semiconductor device comprising a flexible substrate having an interconnecting pattern, an anisotropic conductive material arranged on a surface of the flexible substrate on which the interconnecting pattern is provided, a semiconductor chip provided with electrodes connected to the interconnecting pattern through the anisotropic conductive material, and a support member which is applied to the flexible substrate and secures the flatness. The anisotropic conductive material is provided so as to extend outside the semiconductor chip, and the support member is bonded to the flexible substrate via the anisotropic conductive material.

21 Claims, 4 Drawing Sheets

US 6,335,563 B1

SEMICONDUCTOR DEVICE, METHOD OF FABRICATING THE SAME, CIRCUIT BOARD, AND ELECTRONIC DEVICE

BACKGROUND OF THE INVENTION

1. Field of the Invention

The present invention relates to a semiconductor device, a method of fabricating the same, a circuit board, and an electronic device.

2. Description of Related Art

Bare-chip mounting is ideal for the miniaturization of a semiconductor device, however, since quality assurance and handling are difficult, the semiconductor device has been processed into a package form. In recent years, a Ball Grid Array (BGA) package has been developed to meet the requirements of high pin counts. The BGA package comprises bumps arranged in an area-array configuration on a substrate as external terminals for surface mounting.

One of the BGA packages is a Tape Ball Grid Array (T-BGA) package in which a tape carrier used in a Tape Automated Bonding (TAB) technology is applied as a base. With this T-BGA package, a semiconductor device which is fine-pitched and realizes high pin counts can be provided by making use of the characteristics of the tape carrier.

However, since this tape carrier lacks rigidity and tends to become warped, it is necessary to apply a support plate (stiffener). The same applies to other flexible substrates than the tape carrier. A stiffener is applied using an adhesive conventionally, giving rise to the problem of complicated application steps.

SUMMARY OF THE INVENTION

The present invention solves the aforementioned problem and has an object of providing a semiconductor device produced by simplified steps and a method of fabricating the same, and also providing a circuit board and electronic devices.

(1) A semiconductor device according to the present invention comprises a flexible substrate on which an interconnecting pattern is formed, and a semiconductor chip and a support material that are formed on the flexible substrate using an adhesive; wherein the adhesive is applied at least to a first region of the flexible substrate on which the semiconductor chip is provided, and a second region of the flexible substrate on which the support material is provided.

According to the present invention, the semiconductor chip and the support member are both bonded to the flexible substrate via the adhesive. Accordingly, the adhesive on the flexible substrate bonds both the semiconductor chip and the support member, thereby eliminating the need for providing an adhesive for bonding the support member in addition to an adhesive for bonding the semiconductor substrate.

Therefore, a step of bonding the support member can be omitted.

The support member is for holding the rigidity of the flexible substrate and also contributes to reinforcement of the package. As the support member, for example, rigid materials such as metal plates or materials having high heat resistance are frequently used.

(2) In this semiconductor device, conductive particles may be dispersed in the adhesive, the conductive particles being used to electrically connect electrodes of the semiconductor chip to the interconnecting pattern.

(3) In this semiconductor device, a protective layer may be provided on the interconnecting pattern except areas of connection between the electrodes of the semiconductor chip and the interconnecting pattern.

In this structure, the protective layer protects the interconnecting pattern.

(4) In this semiconductor device, the support member may comprise at least one insulating layer.

This makes it possible to prevent electric conduction between the support member and the interconnecting pattern.

(5) In this semiconductor device, the support member may cover the semiconductor chip.

(6) In this semiconductor device, the support member may be formed of a material with high thermal conductivity.

This support member can also function as a heat-spreader.

(7) In this semiconductor device, the second region may surround the first region.

(8) In this semiconductor device, the support member may hold the flatness of the flexible substrate.

(9) In this semiconductor device, the support member may be thicker than the semiconductor chip.

Because the height of the support member from the flexible substrate is higher than that of the semiconductor chip, the support member can be applied to the flexible substrate without being hindered by the semiconductor device even if a flat tool is used.

(10) In this semiconductor device, a plurality of external electrodes which are electrically connected to the interconnecting pattern may be provided on the surface of the flexible substrate opposite to the surface on which the adhesive is provided.

Since the part of the flexible substrate in which the external electrodes are formed is reinforced by the support member, the coplanarity of the external electrodes can be secured.

(11) In this semiconductor device, the support member may surround the semiconductor chip.

(12) A circuit board according to the present invention is equipped with the above-described semiconductor device.

(13) An electronic device of the present invention comprises the above-described circuit board.

(14) A method of fabricating a semiconductor device according to the present invention comprises the steps of: providing an adhesive on a flexible substrate having an interconnecting pattern; bonding electrodes formed in a semiconductor chip to the interconnecting pattern in a first region of the flexible substrate by the adhesive; and bonding a second region of the flexible substrate that is other than the first region to a support member by the adhesive.

According to the invention, the support member can be applied by making use of the adhesive used for bonding the semiconductor chip to the flexible substrate. Specifically, the support member can be bonded to the flexible substrate only by arranging the adhesive spreading outside the semiconductor chip, whereby the operation of applying an adhesive can be omitted. The support member can be bonded with ease in this manner.

The support member is for securing the flatness of the flexible substrate and also contributes to reinforcement of the package. As the support member, for instance, rigid materials such as metal plates are used in many cases.

(15) In the method of fabricating a semiconductor device, the semiconductor chip may be laid on the adhesive, and pressure may be applied to between the semiconductor chip and the flexible substrate to bond the semiconductor chip.

(16) In the method of fabricating a semiconductor device, conductive particles may be dispersed in the adhesive, and the conductive particles may electrically connect electrodes of the semiconductor chip to the interconnecting pattern by the pressure applied to the adhesive.

(17) In the method of fabricating a semiconductor device, the support member may be laid on the adhesive, and pressure may be applied to between the support member and the flexible substrate to bond the support member.

(18) In the method of fabricating a semiconductor device, the step of applying pressure to between the support member and the flexible substrate may be carried out after the step of applying pressure to between the semiconductor chip and the flexible substrate.

Since the semiconductor chip is applied to the flexible substrate by the face-down bonding, the electrodes can be bonded to the interconnecting pattern before the adhesive deteriorates, and hence better electric connection between them can be assured.

(19) In the method of fabricating a semiconductor device, the support member may surround the semiconductor chip.

(20) In the method of fabricating a semiconductor device, the step of applying pressure to between the support member and the flexible substrate and the step of applying pressure to between the semiconductor chip and the flexible substrate may be carried out at the same time.

In this method, the electric connection of the semiconductor chip and the bonding of the support member can be made simultaneously.

(21) In the method of fabricating a semiconductor device, the adhesive may be formed of a thermosetting material, and the method may further comprise a step of heating the adhesive after the semiconductor chip and the support member are applied to the flexible substrate via the adhesive.

In the case where the adhesive is formed of a thermosetting material, both of the semiconductor chip and the support member can be fixed to the flexible substrate simultaneously by heating them after the both are applied.

DETAILED DESCRIPTION OF THE PREFERRED EMBODIMENT

An embodiment of the present invention will be explained with reference to the drawings. FIGS. 1 to 5 are views showing a method of fabricating a semiconductor device according to the embodiment. In the fabrication method according to the present embodiment, a semiconductor device to which a BGA package is applied is fabricated, but the present invention may be applied to the production of a semiconductor device to which a Chip Size/Scale Package (CSP) is applied.

Figure 1:
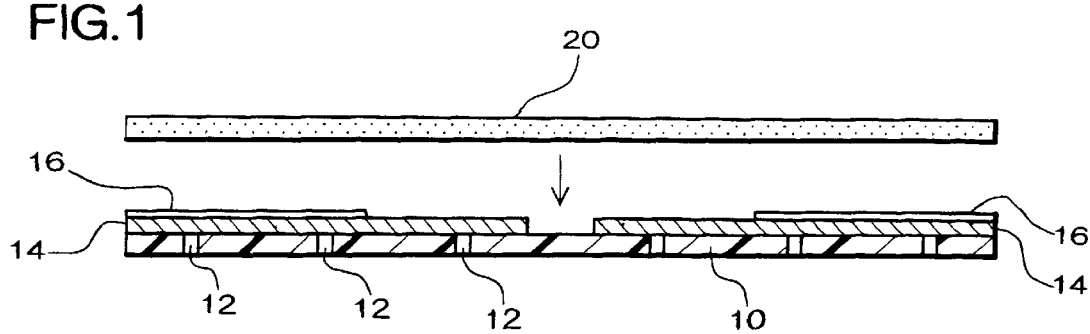
FIG. 1 is a view showing a method of fabricating a semiconductor device according to an embodiment of the present invention.

In the present embodiment, a discrete flexible substrate 10 as shown in FIG. 1 is used. Alternatively, for example, a long tape carrier used in a TAB technology may be used. In this case, the tape carrier is punched into a discrete portion in another step.

The flexible substrate 10 is formed of a polyimide resin, for example, and has insulation characteristics, but the material is not limited to a polyimide resin. In the flexible substrate 10, a plurality of through-holes 12 are formed as shown in FIG. 1. An interconnecting pattern 14 is formed so that it covers the through-holes 12. In areas above the through-holes 12 of the interconnecting pattern 14, there are provided lands each having a large area. In this structure, external electrodes 50 (see FIG. 5) can be formed by using the through-holes 12 on the surface of the flexible substrate 10 opposite to the surface with the interconnecting pattern 14 formed thereon. In an area of the interconnecting pattern 14 other than the through-holes 12, lands (not shown) for the connection to electrodes 32 of a semiconductor chip 30 are formed.

The through-holes 12 are formed both within and outside the area equipped with the semiconductor 30. This makes it possible to provide a FAN-IN/FAN-OUT type semiconductor device 1 that has external electrodes 50 both within and outside the area equipped with the semiconductor 30. According to the present invention, the formation of the external electrodes 50 within the area equipped with the semiconductor chip 30 is not essential, and the through-holes 12 may be formed in a manner so that the external electrodes 50 are formed only outside the area equipped with the semiconductor chip 30.

A protective layer 16 is formed on the flexible substrate 10. The protective layer 16 covers the interconnecting pattern 14 for protection except for an area including at least the joint between the interconnecting pattern 14 and the semiconductor chip 30. For the protective layer 16, it is desirable to use an insulating material such as a solder resist.

As well as the single-sided flexible substrate 10 as described in this embodiment, a double-sided flexible substrate may be used. In the latter, the external electrodes may be formed on the lands formed on a surface opposite to the surface provided with the semiconductor chip. Alternatively, a multilayered flexible substrate or a built-up-type flexible substrate may be used.

In this embodiment, both of the face-up bonding and the face-down bonding can be used to mount the semiconductor chip 30. In the face-up bonding, the electrodes 32 of the semiconductor chip 30 is usually connected to the interconnecting pattern 14 by the wire bonding or TAB bonding and then the area provided with the semiconductor chip is covered with a resin. Examples of the face-down bonding include a bonding using conductive resin paste, a bonding utilizing metal junction by Au-Au, Au-Sn, or a solder, and a bonding using the shrinkage force of an insulating resin. Any one of these bonding types may be used. The present embodiment will be described in detail below, taking the face-down bonding of the semiconductor chip 30 by an anisotropic conductive material 20 as an example.

The anisotropic conductive material 20 is arranged on the surface of the flexible substrate 10 on which the interconnecting pattern 14 has been formed. The anisotropic conductive material 20 comprises conductive particles (fillers) dispersed in an adhesive (binder). Although a thermosetting resin is used as an adhesive in this embodiment, it may be replaced with a thermoplastic resin. As the anisotropic conductive material 20, an anisotropic conductive film in a sheet form is usually used, but alternatively anisotropic conductive material in a liquid state may be used. Although an anisotropic conductive film (ACF) is used as an adhesive in this embodiment, an insulating adhesive may be used instead, since the adhesive is used to bond the semiconductor chip 30.

The anisotropic conductive material 20 is provided on the flexible substrate 10, extending over the area for mounting the semiconductor chip 30 (a first region, facing the surface of the semiconductor chip 30 on which the electrodes 32 are provided) and also over the area surrounding the first region (a second region). In other words, the anisotropic conductive material 20 is also provided on the protective layer 16. Note that on the surface opposite to the second region, there will be provided the external electrodes 50 as described later.

Figure 2:
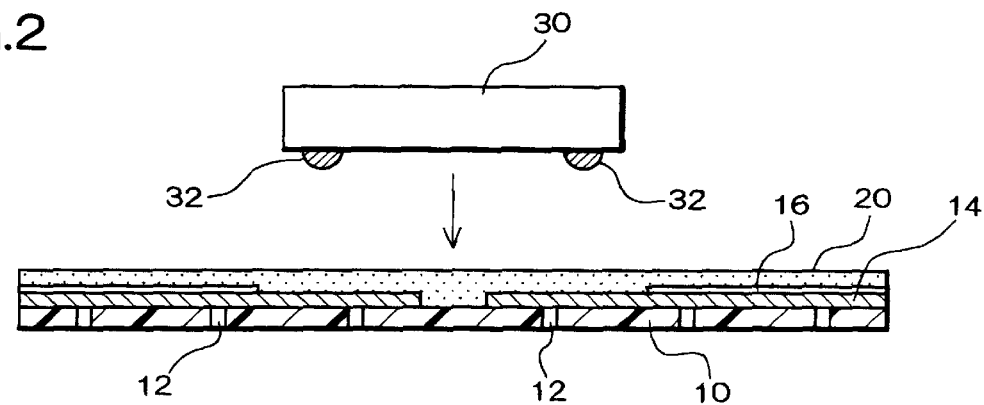
FIG. 2 is a view showing the method of fabricating a semiconductor device according to the embodiment of the present invention.

Next, as shown in FIG. 2, the surface provided with the plurality of electrodes 32 of the semiconductor 30 is pressed to the anisotropic conductive material 20. This step is performed after the electrodes 32 are aligned with the lands (not shown) of the interconnecting pattern 14. By this operation, conductive particles contained in the anisotropic conductive material 20 are pressed between the electrode 32 of the semiconductor chip 32 and the interconnecting pattern 14 thereby electrically connecting the electrode 32 to the interconnecting pattern 14. In this time, the adhesive in the anisotropic conductive material 20 is not yet cured.

Figure 3:
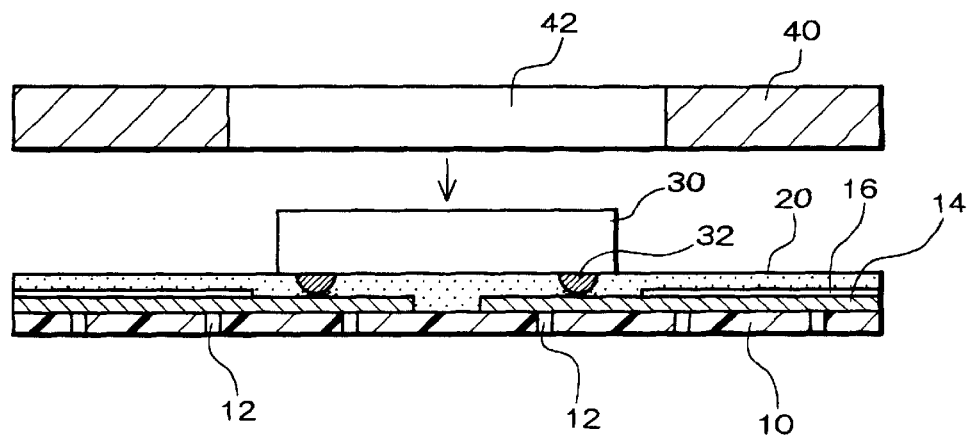
FIG. 3 is a view showing the method of fabricating a semiconductor device according to the embodiment of the present invention.

Next, as shown in FIG. 3, the support member 40 is attached to the flexible substrate 10. The support member 40 is used to reinforce the flexible substrate 10 and to secure the flatness. There are no particular limitations on materials to be used for the support member 40 insofar as it is rigid. For example, as the material for the support member 40, a metal such as stainless steel or a copper-based alloy is often used, but also an insulating material such as plastic or ceramics may be used. In this embodiment, the protective layer 16 is arranged on the interconnecting pattern 14. When the metal support member 40 is used, if the protective layer 16 has an insulating property, the electric connection between the interconnecting pattern 14 and the support member 40 can be prevented. If the support member 40 is formed of an insulating material, the protective layer 16 may be omitted. If an insulating layer is provided at least on a surface of the support member 40 that faces the anisotropic conductive material 20, the electrical connection between the interconnecting pattern 14 and the support member 40 can be prevented even if the support member 40 is metallic.

In the center of the support member 40, an opening 42 is formed to avoid the semiconductor chip 30. In other words, the support member 40 encloses the semiconductor chip 30, for example, in a rectangular frame form. The support member 40 is bonded to the flexible substrate 10 through the anisotropic conductive material 20 on the periphery of the semiconductor chip 30. It is desirable that the thickness of the support member 40 be greater than that of the semiconductor chip 30. This ensures that the semiconductor chip 30 does not hinder the mounting of the support member 40 to the flexible substrate 10 using a flat tool when the semiconductor chip 30 has been previously mounted on the flexible substrate 10.

It is preferable to apply the support member 40 to the flexible substrate 10 after applying the semiconductor chip 30 to the flexible substrate 10 by the face-down bonding. Because the electrodes 32 can be bonded to the interconnecting pattern 14 before the anisotropic conductive material 20 deteriorates, good electric connection between the two can be obtained.

Figure 4:
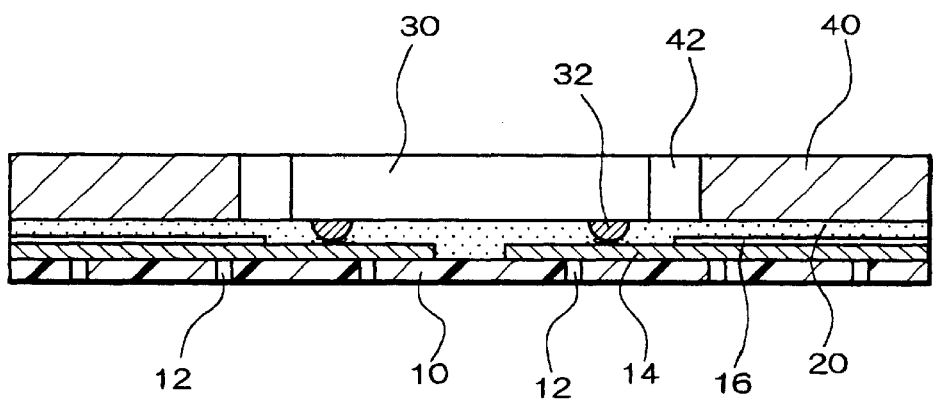
FIG. 4 is a view showing the method of fabricating a semiconductor device according to the embodiment of the present invention.

Next, in the condition as shown in FIG. 4, the entire anisotropic conductive material 20 is heated. As described, the anisotropic conductive material 20 that is formed of a thermosetting material is cured by heating. In this manner, the semiconductor chip 30 and the support member 40 are fixed to the flexible substrate 10.

Figure 5:
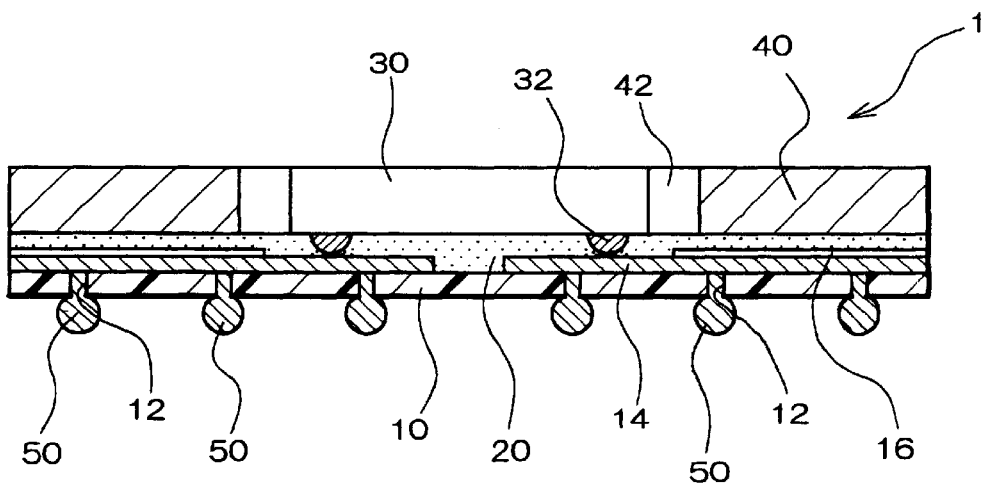
FIG. 5 is a view showing the method of fabricating a semiconductor device according to the embodiment of the present invention.

Then, as shown in FIG. 5, the external electrodes 50 are provided to be electrically connected to the interconnecting pattern 14 through the through-holes 12. In this embodiment, the external electrodes 50 are solder balls. In the formation of a solder ball, after provision of a small round mass of solder and flux or a solder cream, a reflow step of heating and melting is carried out. Therefore, the above-described heating step of the anisotropic conductive material 20 may be omitted and the anisotropic conductive material 20 may be heated at the same time as the solder balls are formed in this reflow step. At least one (plural in many cases) of the external electrodes 50 is disposed on the backside of the second region in which the support member 40 is provided. This ensures that the coplanarity of the external electrodes 50 is secured by the the support member 40.

In the semiconductor device 1 thus obtained, both the semiconductor device 30 and the support member 40 are bonded to the flexible substrate 10 through the anisotropic conductive material 20. Since it is unnecessary to use an adhesive for bonding the support member 40 in addition to that used for the anisotropic conductive material 20, the step of bonding the support member 40 can be carried out with ease.

Figure 6:
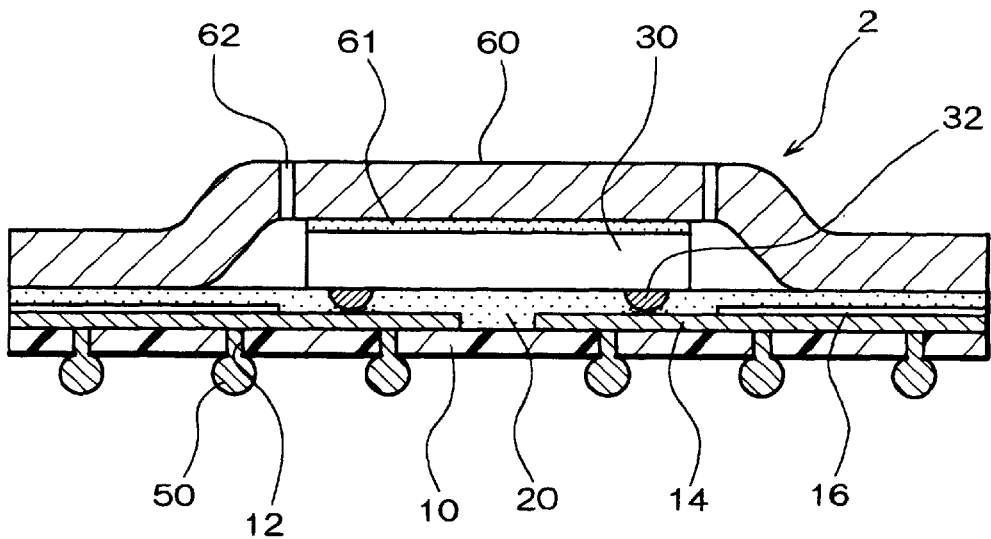
FIG. 6 is a view showing a modification of the embodiment of the present invention.

FIG. 6 is a view showing a modification of this embodiment. A semiconductor device 2 shown in FIG. 6 has the same structure as the semiconductor device 1 except the structure of a support member 60. Accordingly, the same parts are represented by the same numerals.

The support member 60 is not only bonded to the flexible substrate 10 by the anisotropic conductive material 20 but also in contact with the semiconductor chip 30. Specifically, the support member 60 is in contact with the flexible substrate 10 at the peripheral section and is in contact with the surface of the semiconductor device 30 opposite to the surface with the electrode 32 formed in the center thereon. Because of this, the support member 60 has a form with the center caved in. Alternatively, it can perform the same function by having a convex section formed in the center. It is preferable that the contact section between the support member 60 and the semiconductor chip 30 be bonded using a heat-conductive adhesive (not shown). It is also preferable that the support member 60 be formed of a material with high heat-conductivity.

According to this structure, the heat generated by the operation of the semiconductor device 30 can be transferred to the support member 60 since the semiconductor chip 30 is in contact with the support member 60. It is particularly preferable that the semiconductor chip 30 be bonded to the support member 60 by using an adhesive 61 with high heat conductivity. As a consequence, the support member 60 enables heat radiation from a wider area. In this sense, the support member 60 operates as a heat-spreader, promoting the radiation of heat from the semiconductor 30.

Since it is not preferable to form a closed space between the support member 60 and the substrate 10, at least one hole 62 is formed in the support member 60. Alternatively, a hole may be formed in the substrate 10.

Moreover, the steps resulting in the condition shown in FIG. 4 can be modified. For example, after the anisotropic conductive material 20 is arranged on the flexible substrate 10 as shown in FIG. 1, the semiconductor chip 30 and the support member 40 may be mounted on the anisotropic conductive material 20 either simultaneously or in separate steps to press the both at the same time. By this operation, the electrical connection of the semiconductor chip 30 and the mounting of the support member 40 to the anisotropic conductive material 20 can be simultaneously performed. In this case, the support member 60 shown in FIG. 6 may be used instead of the support member 40.

Figure 7:
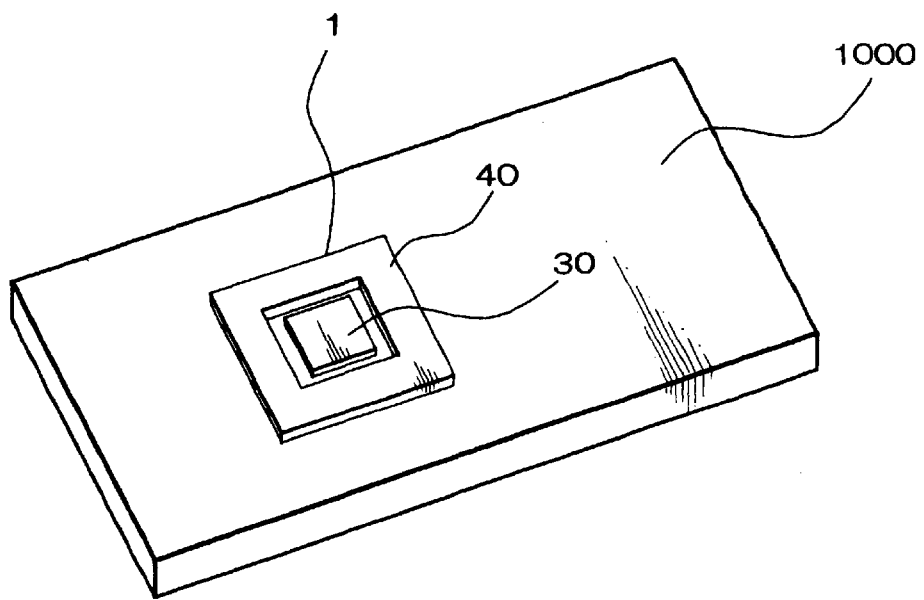
FIG. 7 is a view showing a circuit board according to the embodiment of the present invention.

FIG. 7 shows a circuit board 1000 equipped with a semiconductor device 1 according to the present invention. An organic substrate such as a glass epoxy substrate is generally used as the circuit board. In the circuit board, an interconnecting pattern of, for example, copper is formed to provide a desired circuit. By mechanically connecting the interconnecting pattern to the external electrodes 50 of the semiconductor device 1, electrical connection between the two can be obtained.

Figure 8:
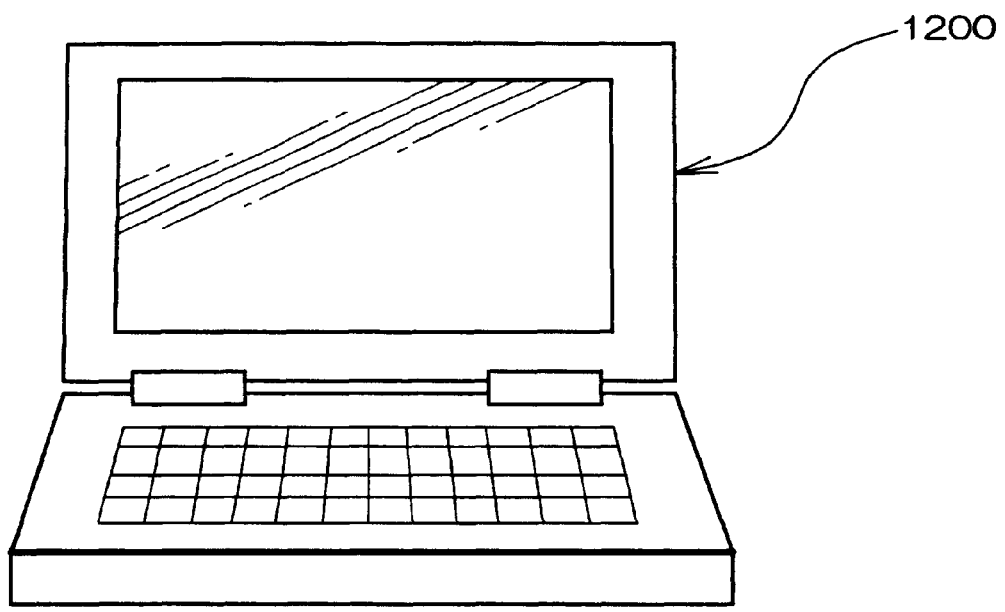
FIG. 8 is a view showing an electronic device provided with a circuit board mounted with a semiconductor device produced by applying a method according to the present invention.

FIG. 8 shows a note-type personal computer 1200 as an electronic device provided with the circuit board 1000.

It should be noted that, the present invention can be applied to various surface-mounted electronic components requiring a plurality of bumps similar to a semiconductor device, whether active or passive. Electronic components include, for example, resistors, capacitors, coils, oscillators, filters, temperature sensors, thermistors, varistors, variable resistors, and fuses.

What is claimed is:

1. A semiconductor device comprising:
   a flexible substrate having an interconnecting pattern formed thereon, a first region, and a second region;
   a semiconductor chip and a support member that are formed on the flexible substrate using an adhesive; and
   a supporting member formed on the flexible substrate using an adhesive;
   wherein the adhesive is formed at least on said first region and on said second region.

2. The semiconductor device as defined in claim 1, wherein conductive particles are dispersed in the adhesive, the conductive particles being used to electrically connect electrodes of the semiconductor chip to the interconnecting pattern.

3. The semiconductor device as defined in claim 2, wherein a protective layer is provided on the interconnecting pattern except areas of connection between the electrodes of the semiconductor chip and the interconnecting pattern.

4. The semiconductor device as defined in claim 1, wherein the support member comprises at least one insulating layer.

5. The semiconductor device as defined in claim 1, wherein the support member covers the semiconductor chip.

6. The semiconductor device as defined in claim 5, wherein the support member is formed of a material having high thermal conductivity.

7. The semiconductor device as defined in claim 1, wherein the second region surrounds the first region.

8. The semiconductor device as defined in claim 1, wherein the support member maintains the flatness of the flexible substrate.

9. The semiconductor device as defined in claim 1, wherein the support member is thicker than the semiconductor chip.

10. The semiconductor device as defined in claim 1, wherein a plurality of external electrodes electrically connected to the interconnecting pattern are provided on a surface of the flexible substrate opposite to the surface on which the adhesive is provided.

11. The semiconductor device as defined in claim 1, wherein the support member surrounds the semiconductor chip.

12. A circuit board on which the semiconductor device of claim 1 is mounted.

13. An electronic device comprising the circuit board of claim 12.

14. A method of fabricating a semiconductor device, comprising the steps of:
    providing an adhesive on a flexible substrate having an interconnecting pattern, a first region, and a second region;
    bonding electrodes formed on a semiconductor chip to the interconnecting pattern in said first region of the flexible substrate using the adhesive; and
    bonding said second region of the flexible substrate to a support member using the adhesive.

15. The method of fabricating a semiconductor device of claim 14,
    wherein the semiconductor chip is laid on the adhesive; and pressure is applied between the semiconductor chip and the flexible substrate to bond the semiconductor chip.

16. The method of fabricating a semiconductor device as defined in claim 15,
    wherein conductive particles are dispersed in the adhesive and
    the conductive particles electrically connect said electrodes of the semiconductor chip to the interconnecting pattern by pressure applied to the adhesive.

17. The method of fabricating a semiconductor device of claim 15,
    wherein the step of applying pressure between the support member and the flexible substrate and the step of applying pressure between the semiconductor chip and the flexible substrate are carried out at the same time.

18. The method of fabricating a semiconductor device of claim 14,
    wherein the support member is laid on the adhesive and pressure is applied between the support member and the flexible substrate to bond the support member.

19. The method of fabricating a semiconductor device of claim 18,
    wherein the support member surrounds the semiconductor chip.

20. The method of fabricating a semiconductor device of claim 18,
    wherein the step of applying pressure between the support member and the flexible substrate is carried out after the step of applying pressure between the semiconductor chip and the flexible substrate.

21. The method of fabricating a semiconductor device of claim 14,
    wherein the adhesive is formed of a thermosetting material; and
    wherein the method further comprises a step of heating the adhesive after the semiconductor chip and the support member are applied to the flexible substrate via the adhesive.

* * * * *